(12) United States Patent
Stewart (10) Patent No.: US 6,376,937 B1
(45) Date of Patent: *Apr. 23, 2002

(54) METER COLLAR WITH INTERFACE FOR CONNECTING ON-SITE POWER SOURCE, AND THE INTERFACE ITSELF

(75) Inventor: Robert S. Stewart, Alexandria, VA (US)

(73) Assignee: Potomac Capitol Investment Corp., Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/698,182

(22) Filed: Oct. 30, 2000

Related U.S. Application Data (63) Continuation of application No. 09/325,735, filed on Jun. 4, 1999.
(60) Provisional application No. 60/088,867, filed on Jun. 11, 1998.

(51) Int. Cl.⁷ .................................................. H02J 7/00
(52) U.S. Cl. ....................... 307/125; 307/112; 307/115; 307/113; 307/64; 307/43
(58) Field of Search .............................. 307/43, 64, 65, 307/70, 76, 80, 85, 141, 112, 125, 150, 149, 113, 115

(56) References Cited

U.S. PATENT DOCUMENTS

| | | |
|---|---|---|
| 2,606,232 A | 8/1952 | St. John |
| 2,738,672 A | 3/1956 | Smith et al. |
| 3,361,938 A | 1/1968 | Watson |
| 3,599,047 A | 8/1971 | Margarian |
| 3,643,209 A | 2/1972 | Coston |
| 3,654,484 A | 4/1972 | Jorgenson et al. |
| 4,167,680 A | 9/1979 | Gross |
| 4,180,744 A | 12/1979 | Helwig, Jr. |
| 4,258,968 A | 3/1981 | Holt |
| 4,311,354 A | 1/1982 | Robinson et al. |
| 4,315,163 A | 2/1982 | Bienville |
| 4,405,867 A | 9/1983 | Moalker et al. |
| 4,430,579 A | 2/1984 | Wiktor |
| 4,521,692 A | 6/1985 | Geniut et al. |
| 4,652,770 A | 3/1987 | Kumano ..................... 307/66 |
| 4,686,375 A | 8/1987 | Gottfried |
| 4,977,482 A | 12/1990 | Langdon et al. |
| 4,994,981 A | 2/1991 | Walker |
| 5,055,702 A | 10/1991 | Bhattacharya |
| 5,070,252 A | 12/1991 | Castenschiold et al. |
| 5,088,004 A | 2/1992 | Howell |
| 5,191,229 A | 3/1993 | Davis et al. |
| 5,216,802 A | 6/1993 | Cole et al. |
| 5,268,850 A | 12/1993 | Skoglund |
| 5,309,031 A | 5/1994 | Stewart et al. |

(List continued on next page.)

FOREIGN PATENT DOCUMENTS

| | | |
|---|---|---|
| GB | 1109886 | 4/1968 |
| GB | 1512140 | 5/1978 |
| GB | 2293703 A | 4/1996 |

*Primary Examiner*—Josie Ballato
*Assistant Examiner*—Robert Deberadinis
(74) *Attorney, Agent, or Firm*—Venable; Norman N. Kunitz (57) ABSTRACT

An interface circuit permits a customer who receives two-phase service from an electrical utility company to use power from an on-site source instead of or in addition to the utility company's power. Several embodiments are disclosed, in some of which the interface circuit automatically disconnects the utility company's power lines if the utility's power is lost and connects the on-site power source. The interface circuit may be installed in whole or in part in a meter collar which fits between an electric meter and the meter socket box that the meter would otherwise plug into.

11 Claims, 8 Drawing Sheets

U.S. PATENT DOCUMENTS

| | | | |
|---|---|---|---|
| 5,385,486 A | | 1/1995 | Robinson et al. |
| 5,390,068 A | | 2/1995 | Schultz et al. |
| 5,541,457 A | | 7/1996 | Morrow |
| 5,546,269 A | | 8/1996 | Robinson et al. |
| 5,571,031 A | | 11/1996 | Robinson et al. |
| 5,572,396 A | | 11/1996 | Robinson et al. |
| 5,581,133 A | | 12/1996 | Smith et al. |
| 5,590,179 A | | 12/1996 | Shincovich et al. |
| 5,612,581 A | | 3/1997 | Kageyama |
| 5,617,287 A | | 4/1997 | Allina |
| 5,621,254 A | | 4/1997 | Takeda et al. |
| 5,633,539 A | | 5/1997 | Tassitino, Jr. |
| 5,642,002 A | * | 6/1997 | Mekanik et al. ............... 307/64 |
| 5,652,416 A | | 7/1997 | Sharaf et al. |
| 5,668,705 A | | 9/1997 | Balch et al. |
| 5,672,823 A | | 9/1997 | Lachmann et al. |
| 5,684,710 A | | 11/1997 | Ehlers et al. |
| 5,696,695 A | | 12/1997 | Ehlers et al. |
| 5,761,027 A | | 6/1998 | Flegel |
| 5,880,536 A | | 3/1999 | Mardirossian |
| 5,886,561 A | * | 3/1999 | Eitan et al. .................. 327/408 |
| 5,892,297 A | | 4/1999 | Penoyer |
| 5,895,981 A | | 4/1999 | Flegel |
| 5,903,065 A | | 5/1999 | Dragos |
| 5,939,799 A | | 8/1999 | Weinstein |
| 5,939,801 A | | 8/1999 | Bouffard et al. |
| 5,952,739 A | | 9/1999 | Grass et al. |
| 6,020,657 A | | 2/2000 | Liran |
| 6,074,246 A | | 6/2000 | Seefeldt et al. |

\* cited by examiner

METER COLLAR WITH INTERFACE FOR CONNECTING ON-SITE POWER SOURCE, AND THE INTERFACE ITSELF

CROSS-REFERENCE TO RELATED APPLICATIONS

This application is a continuation of application Ser. No. 09/325,735, filed Jun. 4, 1999, and, like the parent application (that is, application Ser. No. 09/325,735), claims the benefit of provisional application No. 60/088,867, filed Jun. 11, 1998. Application Ser. No. 09/325,735 matured into U.S. Pat. No. 6,188,145 on Feb. 13, 2001. The disclosures of the provisional application and the parent application are incorporated herein by reference.

BACKGROUND OF THE INVENTION

The present invention is directed to a collar for a watt-hour meter, and more particularly to a meter collar which is configured for a use with an interface circuit that facilitates using an on-site energy source in lieu of or in addition to commercial power from an electric utility company. The interface circuit may isolate the utility company's power lines when the on-site source is used, or it may permit the on-site power source to be used in parallel with commercial power. The invention is also directed to an interface circuit itself, whether it is used in conjunction with a meter collar or is instead associated with other components of a customer's private electrical distribution system, such as a meter socket box or a circuit breaker box.

Some customers of commercial electrical utility companies would like the option of using power which they, the customers, generate or store locally, or on-site. The customer's on-site power source may comprise, for example, a generator which is powered by a gasoline or diesel engine or a combustion turbine, a solar cell array which charges storage batteries that then supply electricity to an inverter for conversion to alternating current, a fuel cell and an inverter, or simply back-up storage batteries which are kept charged using commercial power and which supply power through an inverter when necessary.

Among the problems that typically confront a customer who wants the option of using either his or her on-site power source or the utility company's power is that the modifications in the wiring of the customer's private electrical distribution system (at the customer's residence, for example, or at a small business establishment receiving two-phase service) to accommodate the on-site power source are relatively expensive. Another problem is that the customer's electrical distribution system should either be isolated from the utility company's power lines, or connected to the power lines in a carefully controlled manner, when the on-site power source is used. The isolation option not only prevents possible damage to the utility company's distribution system and to the loads of other customers, it also protects technicians who may be working on the utility company's power lines from electricity generated by the customer's on-site power source. Safety is a paramount concern for utility companies, which train their line technicians to make sure the lines they are working are on are electrically isolated from the utility company's generating facilities. It is not customary for line technicians to also isolate the segments they are working on from the customers, however, unless the technicians have been specifically trained to do so.

Despite this potential hazard, it may desirable to permit a customer to use his or her own on-site power source in parallel with the utility's power, so that both the on-site power and the utility's power can be consumed by the customer's loads. If the utility permits, parallel operation would also allow excess on-site power to be coupled to the utility's power lines for distribution to other customers.

Figure 1:
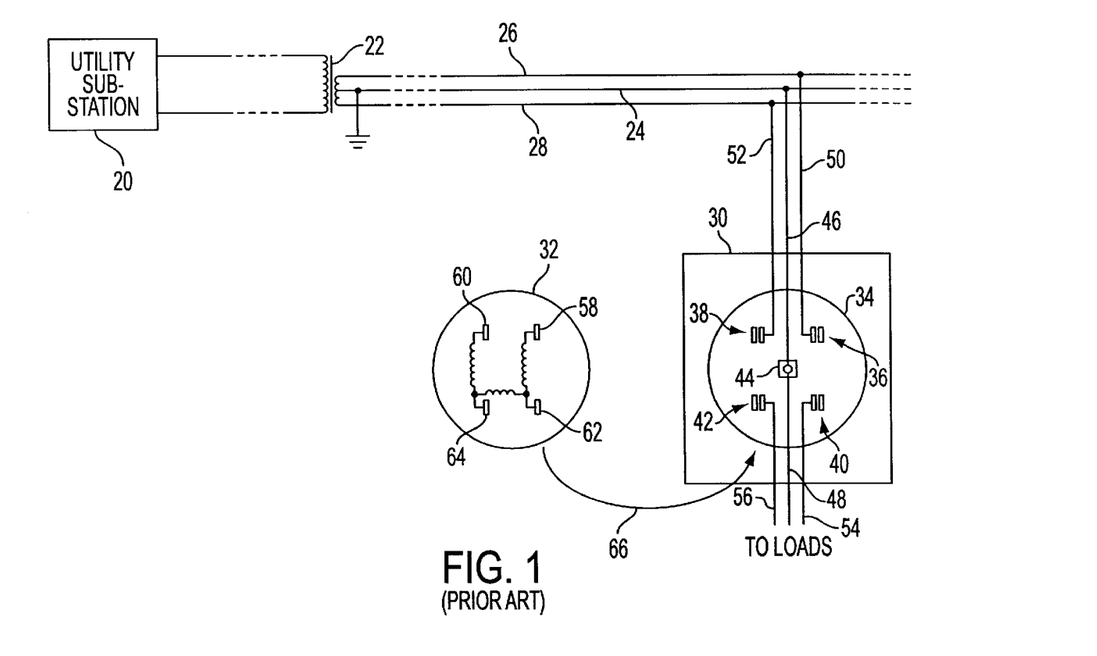
FIG. 1 is a schematic drawing illustrating a typical example of how a public utility company's power distribution system supplies two-phase power via a meter to a customer.

FIG. 1 illustrates a typical prior art arrangement illustrating how a utility's distribution system may be connected to the private distribution system of a customer who receives two-phase service (such as a residential customer with 110-volts/220-volt service or a small business owner with 110-volt/220-volt service). A utility substation 20 receives power at a high voltage from a generating station (not illustrated) and distributes this power (at a stepped-down but nevertheless relatively high voltage and in three phrases) to a network which includes a step-down transformer 22. The primary winding of the transformer 22 receives one of the phases from the substation 20, and the secondary winding in center-tapped. The center tap, which is grounded, is connected to a neutral power line 24. A "leg 1" of the secondary winding is connected to a leg-1 power line 26 and a "leg 2" of the secondary winding is connected to a leg-2 power line 28. The potential difference between the leg-1 power line 26 and the neutral line 24 is typically 110 volts (average) and the potential difference between the leg-2 power line 28 and is also typically 110 volts (average). However, leg-1 power line 26 is 180° out of phase with the leg-2 power line 28. Consequently, a load which is connected between the neutral line 24 and either of the leg-1 or leg-2 power lines 26 and 28 receives 110 volts while a load connected between the leg-1 and leg-2 power lines 26 and 28 receives 220 volts. The two-phase service that is illustrated in FIG. 1 can thus supply power to both 110 volt loads and 220 volt loads that are connected to a customer's private distribution system.

FIG. 1 also shows the front side of a meter socket box 30 and the back side of a watt-hour meter 32. The socket box 30 has a recessed socket 34 with utility-side contacts 36 and 38 and customer-side contacts 40 and 42. Each of the contacts includes a pair of electrically conductive arms (not numbered). The socket 34 also includes a neutral contact 44 that is connected by a neutral service line 46 to the neutral power line 24 and to a neutral line 48 of the customer's private distribution system. The arms of the contact 36 are connected via a leg-1 service line 50 to the leg-1 power line 26 and the arms of the contact 38 are connected via a leg-2 service line 52 to the leg-2 power line 28. The arms of the contact 40 are connected to a leg-1 line 54 of the customer's distribution system while the arms of the contact 42 are connected to leg-2 line 56 of the customer's distribution system With continuing reference to FIG. 1, the back side of the meter 32 is provided with four contacts, 58, 60, 62, and 64. When the meter 32 is plugged into the socket 34 as indicated schematically by arrow 66, the contact 60 is wedged between the arms of the contact 36 to form a connection, the contact 58 is wedged between the arms of the contact 38 to form a connection, the contact 64 is wedged between the arms of the contact 40 to form a connection, and the contact 62 is wedged between the arms of the contact 42 to form a connection. Meter 32 is an electromechanical meter having a Farraday motor and a gear train (not illustrated) which turns dials (not illustrated) when the motor rotates. The meter includes a low resistance winding (not numbered) between the contacts 58 and 62 and another low resistance winding (also not numbered) between the contacts 60 and 64. The meter also includes a high resistance winding (not numbered) between the contacts 62 and 64. The net result is that, when the meter 32 is plugged into the socket 34, the leg-1 line 54 of the customer's distribution system is connected to leg-1 power line 26, the neutral line 48 of the customer's distribution system is connected to neutral power line 24, and the leg-2 line 56 of the customer's distribution system is connected to the leg-2 power line 28. The meter 32 records the watt-hours consumed by the loads connected to the customer's distribution system.

SUMMARY OF THE INVENTION

One object of the present invention is to provide a meter collar which houses, in whole or in part, or which is connected to, an interface circuit that permits easy connection of an on-site power source to a customer's loads while reliably and automatically disconnecting the utility's power lines from the loads.

Another object is to provide a meter collar which houses, in whole or in part, or which is connected to, an interface circuit that permits easy connection of a on-site power source to a customer's loads in parallel with the utility.

Another object is to provide a meter collar which houses, in whole or in part, or is connected to, an interface circuit that responds to a tone waveform that is superimposed on a power waveform (typically 60 Hz) carried by the utility's power lines.

Another object is to provide an interface circuit for performing one or more of the above functions, regardless of whether the interface circuit is housed in whole or in part in a meter collar or is connected to a meter collar, or whether it is used without a meter collar at a location that is electrically downstream from the meter, such as in the meter socket box or in the circuit breaker box.

According to one aspect of the invention, these and other objects which will become apparent in the ensuing detailed description can be attained by providing a meter collar which is configured as an adapter inserted between the meter socket box and the meter, the meter collar including a housing which is provided with first contacts for connection with utility-side contacts of the meter socket box and which is also provided with second contacts for connection with customer-side contacts of the meter socket box. The housing is additionally provided with contacts for connecting the meter. The meter collar also includes an interface circuit having conductors which connect the first contacts to the meter and having means for selectively connecting either the meter or an on-site power source to the second contacts. This means includes primary detection means, such as a relay aid an associated input circuit for the relay, for detecting whether the on-site power source is on and a second detection means, such as another relay and associated input circuit, for detecting whether the utility's power lines are energized, the second detection means being connected to the first detection means.

According to another aspect of the invention, an interface method for connecting a load or loads to either an on-site power source or to power lines of a utility, regardless of whether a meter collar is used, includes the steps of detecting whether the on-site power source is supplying, and opening first switches between the power lines and load or loads if the on-site power source is indeed supplying power. After the first switches have been opened, second switches between the on-site power source and the load or loads are closed. The method additionally includes the step of detecting whether the power lines are supplying power, but only if power supplied by the on-site power source has not been detected. The second switches are opened if power supplied by the power lines is detected, and then the first switches are closed.

In accordance with yet a further aspect of the invention, a meter collar for use between a watt-hour meter and a socket having utility-side contacts which are connected to power lines of a utility and having customer-side contacts which are connected to a load or loads, includes a housing having first contacts for connection to the utility-side contacts of the socket and second contacts for connection to the customer-side contacts of the socket, the housing also having further contacts for connection with the meter. A means is provided for detecting whether a plug is received in a receptacle that is connected to an on-site power source. The meter collar additionally includes an interface circuit having conductors which connect the first contacts to the meter, means for connecting the second contacts to the meter if the plug is not received in the receptacle, and means for connecting the second contacts to the receptacle if the plug is received in the receptacle.

Yet another aspect of the invention provides that a meter collar for use between a watt-hour meter and a socket having utility-side contacts which are connected to power lines of the utility and having customer-side contacts which are connected to a load or loads, includes a housing having first contacts for connection to the utility-side contacts of the socket and second contacts for connection to the customer-side contacts of the socket, the housing additionally having further contacts for connection with the meter. The meter collar also includes an interface circuit having conductors which connects the first contacts to the meter and having means for selectively connecting the second contacts to one or both of the meter and the on-site power source. This means for selectively connecting includes means for detecting whether the on-site power source is supplying power, along with means for connecting the on-site power source to the second terminals, regardless of whether the meter is also connected to the second terminals.

According to still another aspect of the invention, a meter collar for use between a watt-hour meter and a socket having utility-side contacts which are connected to power lines of the utility and having customer-side contacts which are connected to a load or loads, with a tone generator being connected to the power lines, includes a housing having first contacts for connection to the utility-side contacts of the socket and second contacts for connection to the customer-side contacts of the socket, the housing additionally having further contacts for connection with the meter. The meter collar also includes an interface circuit having conductors which connect the first contacts to the meter. The interface circuit additionally has a detector for the tone from the tone generator, and means for selectively connecting the second contacts to either the meter, if the tone is detected, or to the on-site power source, if it is not detected.

DESCRIPTION OF THE PREFERRED EMBODIMENTS

Figure 2:
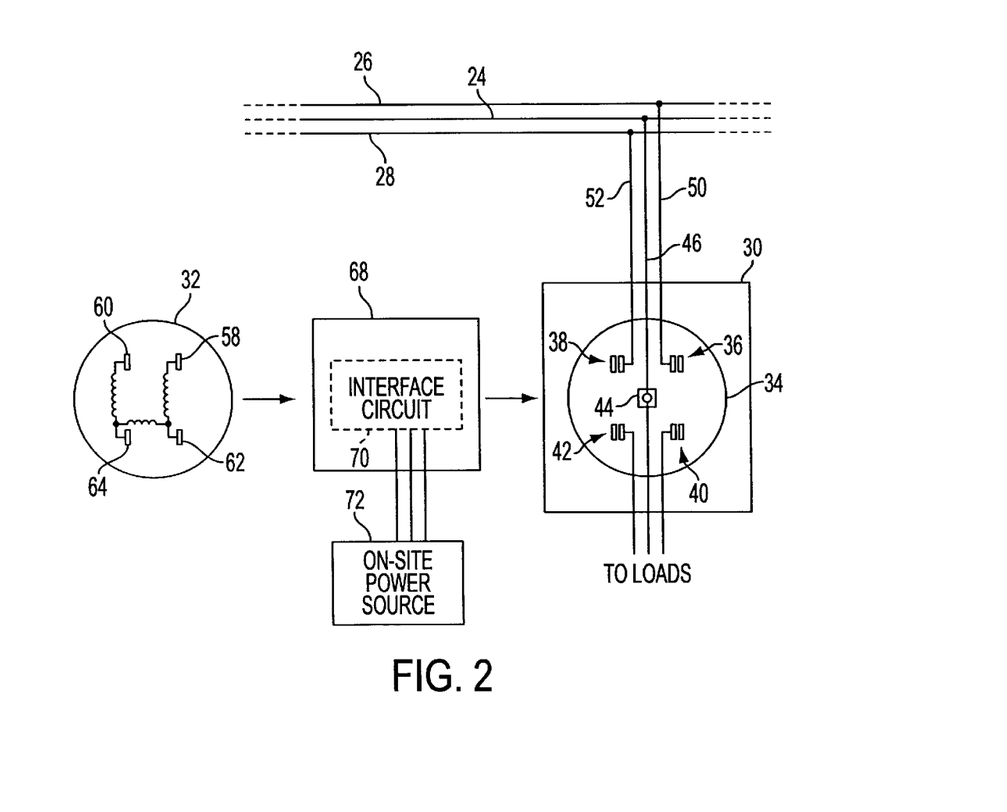
FIG. 2 is a schematic diagram illustrating a generalized embodiment of a meter collar with an interface circuit according to the present invention.

FIG. 2 illustrates a generalized embodiment of a meter collar 68 with an interface circuit 70, which in this case is disposed within the meter collar 68. The right-hand side of the meter collar 68 plugs into the meter socket 34 and has contacts (not illustrated in FIG. 2) which engage the contacts 36–40. The meter 32, in turn, plugs into the left-hand side of the meter collar 68, which has contacts (not illustrated in FIG. 2) for engagement with the contacts 58–64 of the meter. The meter collar 68 thus acts as an adapter between meter 32 and the meter socket box 30, providing access to the lines 48, 54, and 56 of the customer's distribution system. An on-site power source 72 is connected to the interface circuit 70. Several embodiments of suitable interface circuits will be discussed hereafter. As will become apparent during these discussions, depending upon the circuitry employed, the interface circuit 70 may disconnect the power lines 24–28 from the customer's distribution system if the commercial power fails and connect the on-site power source 72 instead, or it may disconnect the commercial power when the customer wants to use his or her on-site power source 72 even though the commercial power has not failed, or the interface circuit 70 may permit that both the utility's power lines 24–28 and the on-site power source 72 to be connected to the service lines 48, 54, and 56 of the customer's distribution system, so that both power sources (commercial and on-site) may be said to supply power to the customer "in parallel."

Turning next to FIGS. 3–6, a more specific embodiment of a meter collar in accordance with the present invention will now be described. In these figures, the meter collar will be identified by reference number 74.

Figure 3:
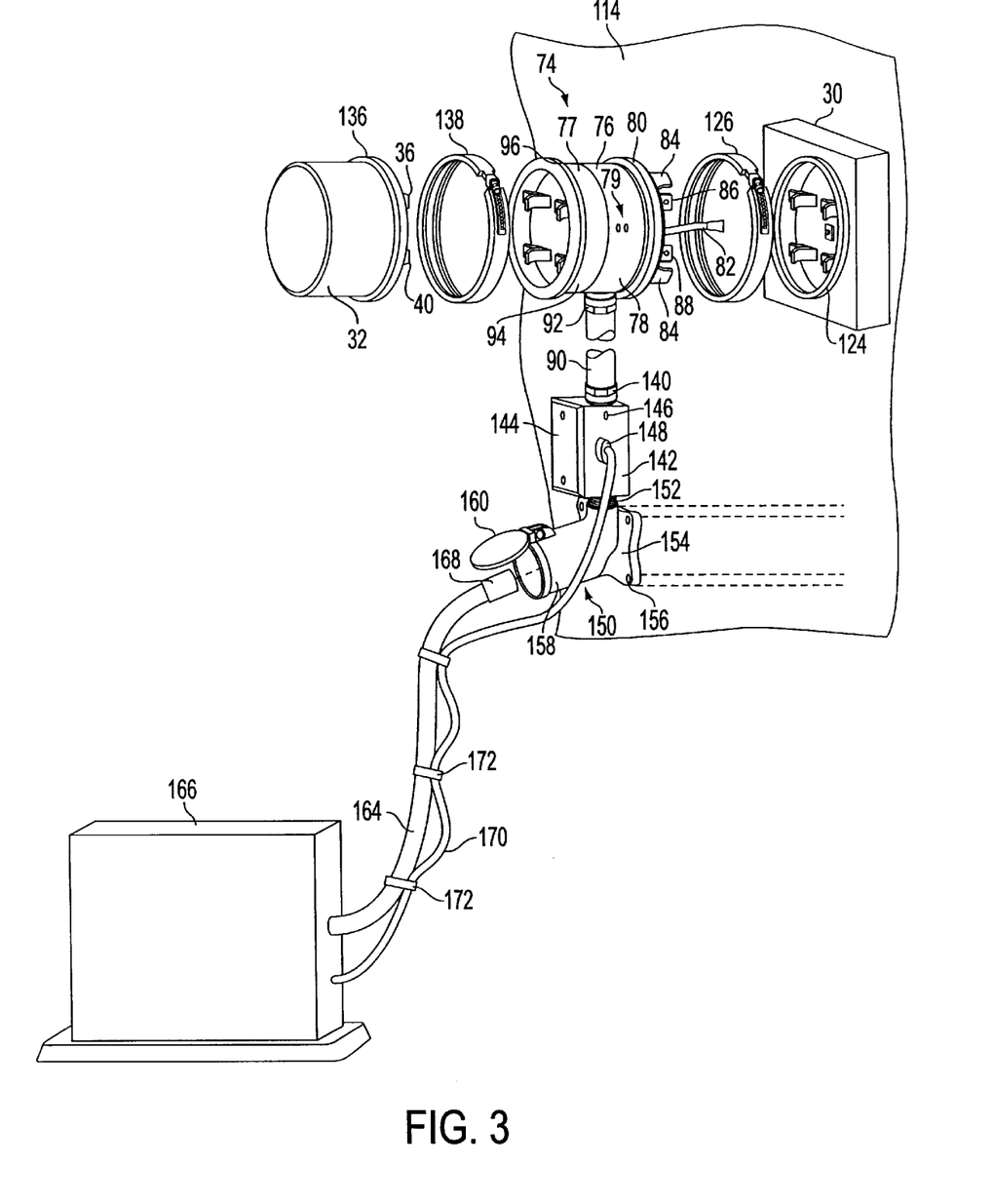
FIG. 3 is an exploded perspective view illustrating a specific embodiment of a meter collar along with associated components.

The meter collar 74 includes a right-side housing member 76 which is joined end-to-end to a left-side housing member 77. The housing member 76 includes a cylindrical wall 78 having a pair of windows 79 in it. A flange 80 is provided at one end of the housing member 76 and a panel 81 is provided within cylindrical wall 78 at a position that is recessed from the flange 80. An insulated wire 82 which terminates in a connector member 83 extends through an opening (not numbered) in panel 81.

Four legs 84 extend from the panel 81. Furthermore, metal contacts 85, 86, 87, and 88 extend through openings (not numbered) in panel 81. A cable 90, which terminates in a fitting 92, includes wiring (which will be discussed later) that extends into the interior of the collar 74.

Figure 7:
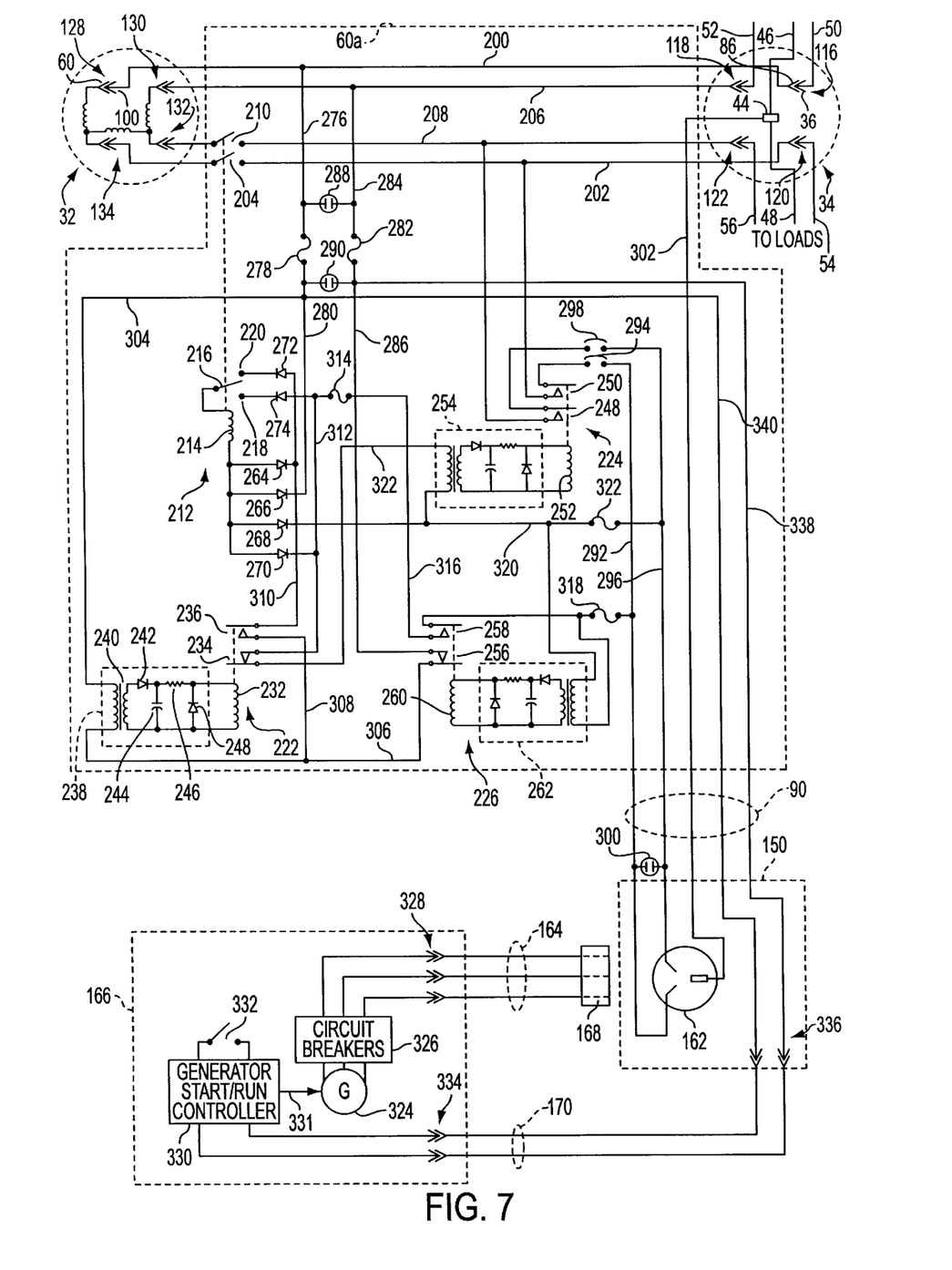
FIG. 7 is a schematic diagram illustrating a first embodiment of an interface circuit.

The left-side housing member 77 includes a cylindrical wall 94, a flange 96 at one end of the wall 94, and a panel 98 at the other end. Contacts 100, 102, 104, and 106 extend through openings (not numbered) the panel 98, each of these contacts including a metal inner arm 108 and a metal outer arm 110 that is split into two segments. An elongated actuator member 112 protrudes through a keyhole-shaped opening (not numbered) in panel 98 (the actuator member 112 is a mechanical part of an electrically controllable latching switch assembly 212 that will be discussed later in conjunction with the embodiment of an interface circuit that is shown in FIG. 7).

The housing members 76 and 77 may be made, for example, from injection-molded plastic. When the housing members are assembled end-to-end in the manner shown in FIGS. 3 and 6, the space between the panel 81 of member 76 and the panel 98 of the member 77 provides a hollow region within the meter collar 74. A printed circuit board 114 for an interface circuit, various embodiments of which will be described later, can be mounted within this space.

FIG. 3 illustrates an example of how the meter collar 74 can be employed between the meter socket box 30 and the meter 32 in practice. The socket box 30 is attached to a wall 114 at the premises of a customer for two-phase electric power, typically 110 volts and 220 volts as was discussed in the "Background of the Invention" section of this document. When meter collar 74 is inserted into a the socket of the box 30, the contact 86 engages the contact 36 (see FIG. 1) to form a connector 116 (see FIG. 7); the contact 85 engages the contact 38 to form a connector 118 (FIG. 7); the contact 88 engages the contact 40 to form a connector 120 (FIG. 7); and the contact 87 engages the contact 42 to form a connector 122 (FIG. 7 again). The wire 82 is connected to the neutral contact 44 before the meter collar 74 is plugged in. The flange 80 of the meter collar 74 abuts against a flange 124 on the socket box 30, and the meter collar 74 is secured to the socket box 30 by a screw-tightened clamp 126 which engages the flanges 80 and 124. When the meter 32 is plugged into the meter collar 64, the contact 60 (see FIG. 1) engages the contact 100 (see FIG. 4) to form a connector 128 (see FIG. 7); the contact 58 engages the contact 102 to form a connector 130; the contact 62 engages the contact 106 to form a connector 132; and the contact 64 engages the contact 104 to form a connector 134. The meter 32 has a flange 136 which abuts against the flange 96 of meter collar 74. A screw-tightened clamp 138 engages the flanges 96 and 136 to secure the meter 32 to the collar 74.

With continuing reference to FIG. 3, the cable 90 is connected by a fitting 140 to a box 142 which is closed by a cover 144. The box has a window 146 and a receptacle (not illustrated) for receiving a plug 148.

A connector assembly 150 includes a threaded pipe portion 152 which extends through an opening (not illustrated) in the box 142 and which receives a nut (not illustrated) to thereby connect the assembly 150 to the box 142. (The threaded region of pipe portion 152 is illustrated in FIG. 3 in order to facilitate the description but would in actual practice extend inside the box 142). The assembly 150 also includes a mounting portion 154 having holes 156. Screws (not illustrated) extend through the holes 156 in order to mount the assembly 150 (and thus also the box 142) on the wall 114. The connector assembly 150 also includes a receptacle portion 158 having a spring-loaded flap 160 which is normally closed to keep out moisture and debris. An electrical receptacle 162 (see FIG. 7) is mounted inside portion 158.

A power cable 164 extends from an on-site power source 166 and terminates in a plug 168 that mates with the receptacle 162 (FIG. 7). A signal cable 170 extending from the power source 166 terminates in the plug 148. Clamps 172 tie the cable 170 to the cable 164.

A first embodiment of an interface circuit 60a for use with the meter collar 74 will now be discussed with reference to FIG. 7. In FIG. 7, a leg-1 conductor 200 couples the connector 116 to the connector 128 and another leg-1 conductor, 202, couples the connector 134 to the connector 120 via a switch 204. A leg-2 conductor 206 couples the connector 118 to the connector 130, and a leg-2 conductor 208 couples the connector 132 to the connector 122 via a switch 210.

Switches 204 and 210 are part of an electrically controllable latching switch assembly 212 which additionally includes a solenoid 214 and an SPDT switch 216 having a "trip" contact or position 218 and a "close" contact or position 220. The switch 216 is mechanically linked to the switches 204 and 210, as is indicted by the dotted line in the figure. The operation of switch assembly 212 can be briefly described as follows: When current flows in one direction through the solenoid 214 for a period of time exceeding a brief minimum, the switches 204 and 210 are closed and latched in the closed position and the switch 216 moves to trip position 218 and is latched in the trip position. When current flows through a solenoid 214 in the opposite direction for a period of time exceeding the brief minimum, the switches 204 and 210 are opened and locked in the open position and the switch 216 moves to close position 220 and is latched in the close position. Further information about the construction and operation of switch assembly 212 is available in U.S. Pat. No. 4,430,579, which is incorporated herein by reference. Switch assembly 212 is commercially available from Automatic Switch Company of Florham Park, N.J., USA.

The interface circuit 60a also includes three interconnected relays—a secondary detection relay 222, a switchover relay 224, and a primary detection relay 226. The secondary detection relay 222 includes a solenoid 232, a normally closed switch 234, and a normally opened switch 236. When the solenoid 232 is energized, the normally closed switch 234 opens and the normally opened switch 236 closes. The solenoid 232 is connected to an input circuit 238 which includes a step-down transformer 240, a rectifying diode 242, a smoothing capacitor 244, a load resistor 246, and a flyback diode 248. The input circuit 238 steps down the voltage received by the primary winding of transformer 240, and converts the stepped-down voltage to DC. The input circuit 238 has a time constant whose value is determined primarily by capacitor 244 and resistor 246.

The switchover relay 224 includes a normally opened switch 248, a normally open switch 250, and a solenoid 252, the solenoid being connected to an input circuit 254. The primary detection relay 226 includes a normally closed switch 256, a normally open switch 258, and a solenoid 260. The solenoid 260 is connected to an input circuit 262. The time constants of input circuits 254 and 262 may be the same as that of input circuit 238.

The cathodes of flyback diode 264, steering diodes 266 and 268, and flyback diode 270 are connected to one end of solenoid 214. The anodes of steering diodes 272 and 274 are connected respectively to the close contact 220 and the trip contact 218 of latching switch assembly 212. A conductor 276 connects the leg-1 conductor 200 to a fuse 278 and a conductor 280 connects the fuse 278 to the anode of diode 266. The leg-2 conductor 206 is connected to a fuse 282 by a conductor 284, and a conductor 286 connects the fuse 282 to the fixed contact of switch 256. A neon glow lamp 288 is connected between conductors 276 and 284 and another neon glow lamp, 290, is connected between conductors 280 and 286. Physically, the glow lamps 288 and 290 are located behind windows 79 (see FIG. 6).

One contact of receptacle 162 is connected via a leg-1 conductor 292 and a circuit breaker 294 to the movable contact of switch 250. The fixed contact of switch 250 is connected to leg-1 conductor 202. Another contact of the receptacle 162 is connected via a leg-2 conductor 296 and a circuit breaker 298 to the movable contact of switch 248. The fixed contact of switch 248 is connected to leg-2 conductor 208. A neon glow lamp 300 is connected between the first and second leg contact 292 and 296. Physically, the neon glow lamp 300 is disposed behind window 146 (see FIG. 3). A third contact of the receptacle 162 is connected by a conductor 302 (which includes the wire 82 shown in FIGS. 3 and 5) to the neutral contact 44.

Figures 4, 5:
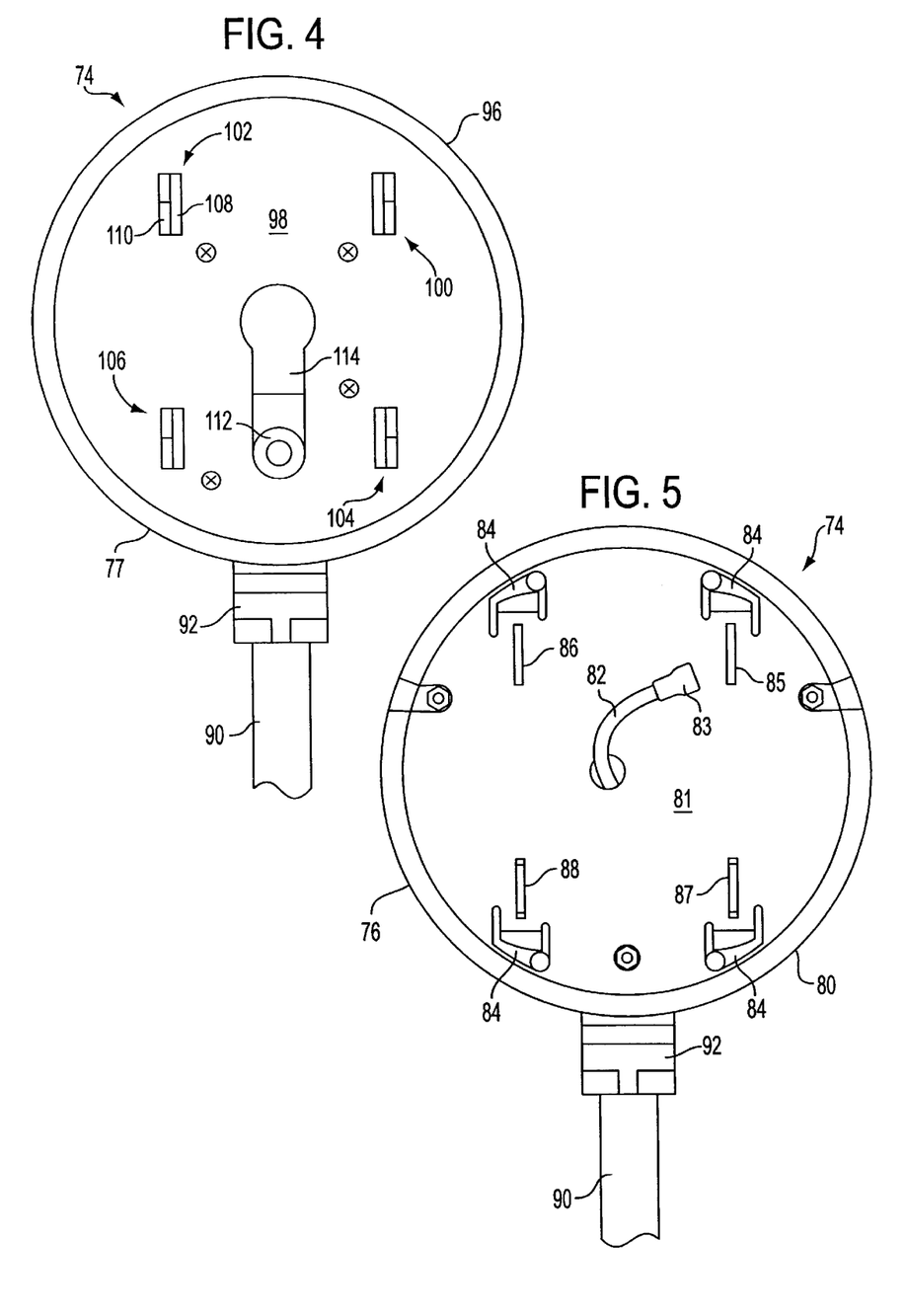
FIG. 4 is a left-side view of the meter collar shown in FIG. 3.
FIG. 5 is a right-side view of the meter collar shown in FIG. 3.
Figure 6:
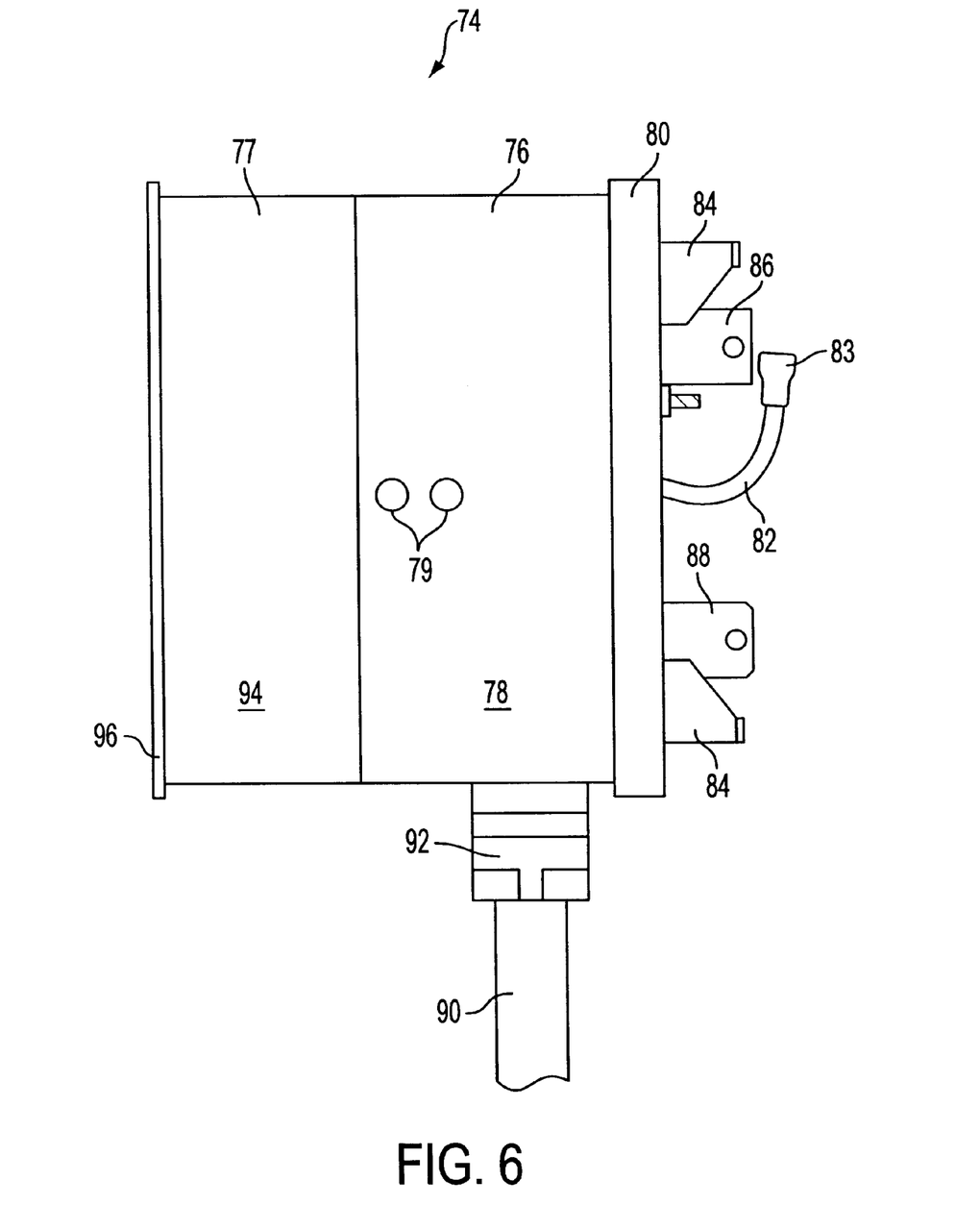
FIG. 6 is a front view of the meter collar shown in FIG. 3.

A conductor 304 connects conductor 280 to one end of the primary winding of transformer 240. The other end of the primary winding is connected by a conductor 306 to the movable contact of switch 256. A conductor 308 connects the conductor 306 to the fixed contact of switch 236, the movable contact of which is connected by a conductor 310 to the anode of diode 264 and the cathode of diode 272. A conductor 312 connects the fixed contact of switch 234 to the anode of diode 270, the cathode of diode 274, and to a fuse 314. The fuse 314 in turn is connected by a conductor 316 to the fixed contact of switch 258. The movable contact of switch 258 is connected via a fuse 318 to the leg-i conductor 292.

The anode of diode 268 is connected by a conductor 320 to one end of a fuse 322, whose other end is connected to the leg-2 conductor 296.

One end of the primary winding of the transformer in input circuit 254 is connected to the conductor 320, while the other end is connected via a conductor 322 to the movable contact of the switch 234. One end of the primary winding of the transformer in input circuit 262 circuit is connected via the fuse 318 to the leg-1 conductor 392, and the other end is connected via the fuse 322 to the leg-2 conductor 296.

The on-site power source 166 may take many forms, and the example shown in FIG. 7 is depicted only schematically. This example includes a generator 324 which is driven by gasoline engine (not illustrated). The generator 324 is connected via circuit breakers 326 and connectors 328 to the cable 164 (also see FIG. 3). A generator start/run controller 330 is provided for starting the gasoline engine using a battery (not illustrated) within the controller 330 and for controlling the speed of the engine thereafter. The controller 330 thus indirectly controls the generator 324 by way of the engine, and this control is indicated schematically by arrow 331. A manual start switch 332 is connected to the controller 330. Furthermore, the controller 330 is connected to the cable 170 (also see FIG. 3) by way of connectors 334. The cable 170 is connected by connectors 336 (which include the plug 148 shown in FIG. 3 and a receptacle, not shown, in box 142) to conductors 338 and 340. The conductor 338 is connected to conductor 286 and the conductor 340 is connected to conductor 280.

It has been found that the steering diodes 266 and 268 may be damaged, in regions where a utility's power lines are subject to unusually strong surges, if the peak inverse voltage ratings of these diodes is not high enough. Diodes with a PIV of a thousand volts are recommended. If surges approaching a thousand volts (or higher) are encountered in a particular region, the latching switch assembly 212 may be modified by adding another SPDT switch (not shown), like switch 216 but connected electrically on the other side of solenoid 214 from switch 216. Latching switch assemblies that are commercially available from Automatic Switch Company at Florham Park, N.J. are configured to permit another switch to be added. The movable contact of the added switch would be connected to solenoid 214 and the two fixed contacts would be connected to the cathodes diodes 266 and 268. The added SPDT switch would isolate the diodes from high reverse voltages during surges.

It is noted that diodes 266 and 272 both have a steering function and turn on simultaneously, so the steering function could be performed by one of the diodes and the other could be omitted. Similarly, one of the diodes 268 and 274 could be omitted.

The operation of interface circuit 60a will now be described, with reference to several cases.

In the first case, Case A, assume the following initial conditions: The utility's power is off (that is, the voltage between leg-1 conductor 200 and leg-2 conductor 206 is zero), the on-site power source 166 is turned off (that is, the voltage between leg-1 conductor 292 and leg-2 conductor 296 is zero), switches 204 and 210 are open and switch 216 is at close position 220, and the capacitors in input circuits 238, 254, and 262 are discharged. Now turn on the commericial power, so that the voltage between leg-1 and leg-2 conductors 200 and 206 rises to approximately 220 voltage AC (average) while the on-site power source 166 remains off. A circuit between leg-1 conductor 200 and leg-2 conductor 206 exists via conductor 276, fuse 278, conductor 304, the primary winding of transformer 240, conductor 306, normally closed switch 256, conductor 286, fuse 282, and conductor 284. Because of this circuit, the voltage across capacitor 244 in input circuit 238 begins to rise. Primary detection relay 226 is in a deactuated state and remains deactuated because the primary winding of the transformer in input circuit 262 is connected across leg-1 and leg-2 conductors 292 and 296, which have been assumed to have a zero potential difference. Switchover relay 224 is in a deactuated state and remains deactuated because one end of the primary winding of the transformer in input circuit 254 is connected via conductor 322, normally closed switch 234, conductor 312, fuse 314, and conductor 316 to normally open switch 258 of relay 226. Although normally closed switch 234 does not open until capacitor 244 has charged sufficiently for relay 222 to be actuated, normally open switch 258 keeps current from flowing through this circuit (regardless of the state of switch 234).

After the voltage across voltage capacitor 244 rises sufficiently, secondary detection relay 222 is actuated and this causes normally closed switch 234 to open and normally open switch 236 to close. The closure of switch 236 connects leg-2 conductor 206 to leg-1 conductor 200 via conductor 284, fuse 282, conductor 286, normally closed switch 256, conductors 306 and 308, the now-closed but normally open switch 236, diode 272, switch 216, solenoid 214, diode 266, conductor 280, fuse 278, and conductor 276. The diodes 272 and 266 become conductive during the first positive half cycle of the utility company's electricity after secondary detection relay 222 has been actuated, so current flows through solenoid 214. This causes switches 204 and 210 to close and causes switch 216 to move from the close position 220 to the trip position 218, thus removing current from solenoid 214. The switches 204, 210 and 216 are latched at their new positions and thus do not change states when the current through solenoid 214 is reduced to zero. The result is that the utility company's leg-1 and leg-2 power lines 50 and 52 are connected to the leg-1 and leg-2 service lines 54 and 56 of the customer's distribution system during Case A while leg-1 and leg-2 conductors 292 and 296 remain disconnected.

In Case B, assume that the utility company's power is turned on, that the circuitry of input circuit 60a is initially in the state that it assumed at the conclusion of Case A, and that the on-site power source 166 is then manually turned on by actuating switch 332 and begins supplying power by way of plug 168 and receptacle 162 (that is, assume that the voltage between leg-1 and leg-2 conductors 292 and 296 changes from 0 volts to 220 volts). A circuit exists between leg-1 and leg-2 conductors 292 and 296 via fuse 318, the primary winding of the transformer in input circuit 262, and fuse 322. Consequently, primary detection relay 226 is actuated after the capacitor in input circuit 262 has charged sufficiently, whereupon switch 256 is opened and switch 258 is closed. With the opening of switch 256, current ceases to flow through the primary winding of transformer 240 (however, secondary detection relay 222 remains actuated briefly due to energy stored by capacitor 244). The closure of switch 258 creates a circuit from leg-1 conductor 292 to leg-2 conductor 296 via fuse 318, switch 258, conductor 316, fuse 314, diode 274, switch 216, solenoid 214, diode 268, conductor 320, and fuse 222. Current begins flowing through this circuit during the first negative half cycle of generator 324 after relay 226 has been actuated. The current through solenoid 214 opens switches 204 and 210 and moves switch 216 to close position 220, thus preventing continued flow to solenoid 214. The switches 204, 210, and 216 are latched in their new positions.

When capacitor 244 discharges sufficiently for secondary detection relay 222 to be deactuated, the switch 236 opens and switch 234 closes. A circuit between leg-l and leg-2 conductors 292 and 296 is created when switch 234 closes, via the fuse 318, switch 258 (which is closed due to the actuation of primary detection relay 226), conductor 316, fuse 314, conductor 312, switch 234, conductor 322, the primary winding of the transformer in input circuit 254, conductor 320, and fuse 322. Switchover relay 224 is therefore actuated shortly after secondary detection relay 222 becomes deactuated. This closes switches 248 and 250, thereby coupling leg-1 conductor 292 to leg-1 conductor 202 and coupling leg-2 conductor 296 to leg-2 conductor 208. As a result, the customer receives power from his or her on-site power source 166 even though commercial power is available. By turning the on-site power source on, the customer elects to switch to it from commercial power.

In Case C, assume that the utility's power is on, that the on-site power source 166 is also on, and that the interface circuit 60a is in the state discussed above at the conclusion of Case B. Then assume that on-site power source 166 is turned off and the voltage between leg-1 and leg-2 conductors 292 and 296 falls to zero. As a result, current ceases to flow through the primary winding of the transformer in input circuit 262 and it also ceases to flow through the primary winding of the transformer in input circuit 254. Primary detection relay 226 and switchover relay 224 are deactuated shortly thereafter, when the capacitors in their input circuits have discharged sufficiently. The deactuation of switchover relay 224 disconnects leg-1 and leg-2 conductors 292 and 296 from leg-1 and leg-2 conductors 202 and 208. The deactuation of primary relay 226 opens switch 258 and closes switch 256, thus causing current to flow through the primary winding of transformer 240. After the expiration of the time constant of input circuit 238, secondary detection relay 222 is actuated and switch 234 is opened while switch 236 is closed. The closure of switch 236 creates a circuit between leg-1 and leg-2 conductors 200 and 206 via conductor 284, fuse 282, conductor 286, switch 256, conductor 306, conductor 308, switch 236, diode 272, switch 216, solenoid 214, diode 266, conductor 280, fuse 278, and conductor 276. The completion of this circuit causes latching switch assembly 212 to change state, so that switches 204 and 210 are closed and latched in their closed position and so that switch 216 moves to trip position 218 and is latched in that position. The net result is that the interface circuit 60a switches back to the utility's power after on-site power source 116 is turned off.

In case D, assume that the utility's power is on, that the on-site power source 116 is on, and that the interface circuit 60a is in the state discussed above at the conclusion of Case C. Then assume that the utility's power goes off, due perhaps to damage to the power lines during a storm. The voltage between conductors 280 and 286 thus falls to zero, information that is conveyed to generator start/run controller 330 via conductors 338 and 340, connectors 336, signal cable 170, and connectors 334. In response the controller 330 starts the engine (not illustrated) that drives generator 324. The voltage between leg-1 conductor 292 and leg-2 conductor 296 rises to 220 volts. Operation then proceeds along the lines discussed above with respect to Case B, so that the service lines 50 and 52 are disconnected from the customer's distribution lines 54 and 56 and the on-site power source 166 is connected instead. Case D provides an "automatic-start" feature which initiates an automatic change from the utility's power to the on-site power source 166 if the utility's power is lost. Of course, the customer also has the option of actuating manual start switch 332 in order to intentionally initiate a change from the utility's power to on-site power, as was described above in the explanation of Case B. The customer might want to intentionally change to on-site power if (for example) a possible commercial power outage is anticipated due to a severe storm.

Some final observations about interface circuit 60a will now be presented, before proceeding to the next embodiment. Relay 226 has been called a "primary detection" relay because it detects whether on-site power source 166 is on or off. That is, subject to delays due to input circuit 262 (and particularly its capacitor) and the relatively modest response speed of the relay itself, the relay 226 is actuated when on-site power source 166 is on (meaning above some predetermined minimum average voltage) and deactuated when it is off. Relay 222 has been called a "secondary detection" relay because it detects whether the commercial power is on or off but is subservient to the primary detection relay 226. That is, subject to delays due to input circuit 238 (and particularly capacitor 244) and the relatively modest response speed of the relay itself, the relay 222 is actuated when the commercial power is on (meaning above some predetermined minimum voltage) and deactuated when it is off, but only if the primary detection relay 226 is in a deactuated state. This is due to the fact that switch 256 of primary detection relay 226 is connected to the input circuit 238 for secondary detection relay 222, thereby operationally interlocking the relays. Relay 224, which is operationally interlocked to both the primary and secondary detection relays 226 and 222 by virtue of their respective switches 258 and 234, has been named a "switchover" relay to suggest its function—connecting on-site power source 166 to leg-1 and leg-2 conductors 202 and 208, in lieu of commercial power from the utility company if the commercial power was on when on-site power source 166 was turned on, depending on the states of primary and secondary detection relays 226 and 222.

As was noted previously, the switch 256 of primary detection relay 226 is present in order to isolate the input circuit 238 for secondary detection relay 222 from the commercial power (i.e., conductor 206) when on-site power source 166 is on and primary detection relay 226 is actuated.

The purpose of switch 258 is to avoid a problem that might otherwise arise if on-site power source 116 is turned on while the commercial power is on. With the commercial power on and the on-site power source off, primary detection relay 222 is in its actuated state, switches 204 and 210 are closed, and switch 216 is at trip position 218. After on-site power source 166 is turned on, there is a brief delay before primary detection relay 226 is actuated. If switch 258 were absent, so that conductor 316 were connected permanently to fuse 318, the trip contact 218 of latching switch assembly 216 would be permanently connected to leg-1 conductor 292. Consequently, latching switch assembly 216 would be actuated when on-site power source 166 is turned on, thereby opening switches 204 and 210 and shifting switch 216 to the close position 220. But switch 256 of primary detection relay 226 would still be closed due to the previously mentioned time delay associated with relay 226, and switch 236 of secondary detection relay 222 would also be closed. As a result, latching switch assembly 212 would be actuated again, closing switches 204 and 210 and shifting switch 216 back to its trip contact 218. This back-and-forth actuation of latching switch assembly 212 would continue until the delay period associated with activation of primary detection relay expired. Furthermore, without switch 258 to isolate the transformer in input circuit 254 from the leg-1 conductor 292, switchover relay 224 might be actuated before primary detection relay 226. This would lead to the possibility that switches 248 and 250 of switchover relay 224 might be closed at the same time as the switches 204 and 210 of latching switch assembly 212, connecting the on-site power source 166 to the service lines 50 and 52. Since it is unlikely that on-site power source 166 would just happen to be matched in phase with the utility, this could cause damage. These adverse consequences can be avoided by including switch 258 in the primary detection relay 226, in order to control the timing of the actuation of latching switch assembly 212 and the connection of input circuit 254 across leg-1 and leg-2 conductors 292 and 296.

Turning next to switch 236 of secondary detection relay 222, this switch is present to ensure that switches 204 and 210 do not close before switches 248 and 250 of switchover relay 224 are opened. It has already been explained (see Case C, above) how switches 204 and 210 are closed to connect the utility to the lines 54 and 56 of the customer's distribution system if the utility is on when the on-site power source 166 stops supplying power. First the primary detection relay 226 is deactuated and then the secondary detection relay is actuated, closing switch its 236 to permit the latching switch assembly 212 to also close its switches 204 and 210 so as to thereby connect the service lines 50 and 52 to the lines 54 and 56 of the customer's distribution system. If switch 236 were not present, so that conductor 308 were connected directly to diode 272, latching switch assembly 212 might close its switches 204 and 210 while switchover relay 224 is still in its actuated state (if the delay associated with the switchover relay 224 were slightly greater than the delay associated with primary detection relay 226). The primary windings of the transformers in input circuits 254 and 262 stop receiving current at the same time when on-site power source 166 is turned off, so the primary detection relay 226 and the switchover relay are deactuated at about the same time, but slight timing differences might arise due to incidental differences in the delays associated with the relays. However, the presence of switch 236 means that the delay period associated with secondary detection relay 222 does not even start until primary detection relay 226 is deactuated, and this in turn ensures that switches 248 and 250 are opened before switches 204 and 210 are closed Switch 234 of the secondary detection relay 222 is also present for timing purposes. Consider what might happen if switch 234 were not present and conductor 322 were connected directly to conductor 312. Then the transformer in input circuit 238 would stop receiving current when primary detection relay 226 is actuated and, at the same time, the transformer in input circuit 254 would start receiving current. Whether switchover relay 224 would be actuated before or after secondary detection relay 222 is deactuated could not be predicted with precision due to incidental variations in the delay times associated with these relays. The presence of switch 234 means that the delay associated with switchover relay 224 when it is being actuated does not start until the delay associated with secondary detection relay 222 when it is being deactuated has expired.

Figure 8:
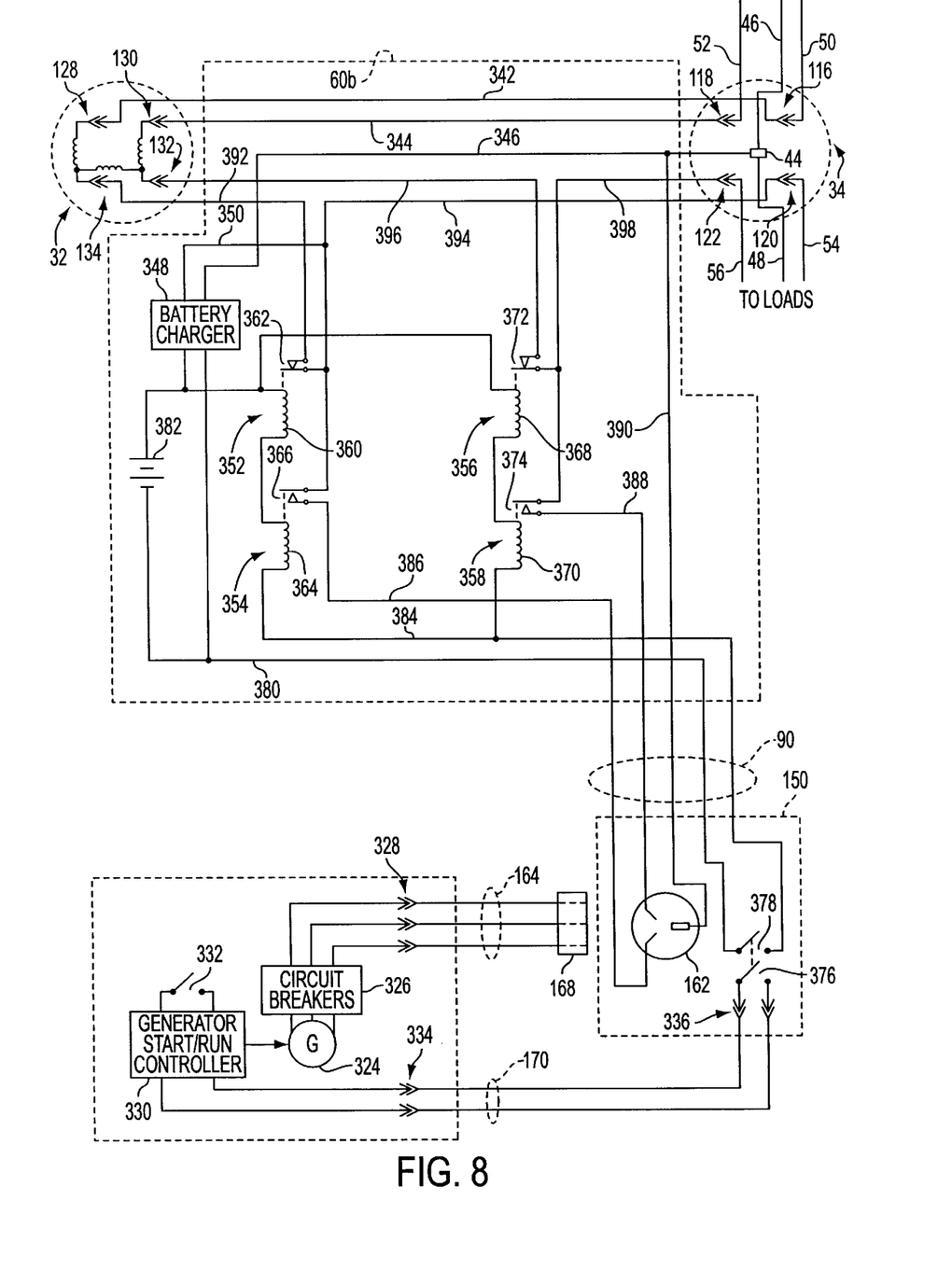
FIG. 8 is a schematic diagram illustrating a second embodiment of an interface circuit.

FIG. 8 illustrates another embodiment of an interface circuit, this embodiment being designated by reference number 60b. It includes a leg-1 conductor 342 which links the connectors 116 and 128 and a leg-2 conductor 344 which links the connectors 118 and 130. A conductor 346 connects the neutral contact 44 to one power input terminal of a battery charger 348. The other power input terminal of the charger 348 is connected to a conductor 350.

The interface circuit 60b also includes relays 352, 354, 356, 358. The relay 352 has a solenoid 360 and a normally closed switch 362. The relay 354 includes a solenoid 364 and a normally open switch 366. Relays 356 and 358 have solenoids 368 and 370 respectively, with relay 356 also including a normally closed switch 372 and relay 358 including a normally open switch 374.

A normally open switch 376 is connected to the connectors 336 and thus also to the controller 330. The switch 376 is mechanically linked to a normally open switch 378. The switches 376 and 378 are mounted in the connector assembly 150 (see FIG. 3) in such a manner that they are engaged by plug 168 (or engaged by a linkage arrangement, not illustrated, which in turn is engaged by the plug 168) when the plug 168 is inserted into the receptacle 162. Such engagement causes the switches 376 and 378 to close. The switch 378 is connected by a conductor 380 to the negative terminal of a rechargeable battery 382, and by a conductor 384 to one end of solenoid 364 and one end of solenoid 370.

One contact of receptacle 162 is connected by a leg-1 conductor 386 to the fixed contact of switch 366. Another contact of the receptacle 162 is connected by a leg-2 conductor 388 to the fixed contact of switch 374. Another contact of the receptacle 162 is connected by a conductor 390 to the conductor 346.

A leg-1 conductor 392 links the connector 134 to the fixed contact of switch 362. Another leg-1 conductor 394 links the connector 120 to the movable contact of switch 362 and to the movable contact of switch 366. A leg-2 conductor 396 links the connector 132 to the fixed contact of switch 372, and another leg-2 conductor 398 links the connector 122 to the movable contact of switch 372 and to the movable contact of switch 374.

The operation of interface circuit 60b will now be described. Unless plug 168 is plugged into receptacle 162, the leg-1 service line 50 is connected to the leg-1 line 54 of the customer's distribution system by way of leg-1 line 342, meter 32, leg-1 line 392, normally closed switch 396, and leg-1 line 394. The leg-2 service line 52 is also connected to the customer's leg-2 line 56 by way of leg-2 line 344, the meter 32, leg-2 line 396, normally closed switch 372, and leg-2 line 398. The leg-1 line 394 is isolated from the leg-1 line 386 by normally open switch 366, and the leg-2 line 398 is likewise isolated from the leg-2 line 388 by the normally open switch 374.

If the plug 168 is plugged into receptacle 162, however, switches 376 and 378 are closed. The closure of switch 376 enables controller 330 to start the gasoline engine (not illustrated) which drives generator 324 when switch 332 is manually actuated. That is, the generator 324 cannot be started unless the plug 168 is plugged into the receptacle 162. The closure of switch 378 permits current from battery 382 to flow through the series connection of solenoids 360 and 364 and also through the series connection of solenoids 368 and 370. The switches 362 and 372 are thus opened, isolating leg-1 conductor 392 from leg-1 conductor 394 and also isolating leg-2 conductor 396 from leg-2 conductor 398. Furthermore, switches 366 and 374 are closed, thus connecting leg-1 conductor 386 to leg-1 conductor 394 and also connecting leg-2 conductor 388 to leg-2 conductor 398. As a result, the customer's distribution system receives power from on-site power source 166 and the utility company's power lines are disconnected. When the generator 324 is turned off and plug 168 is withdrawn, the utility's power lines are connected to the customer's distribution system again.

Protective devices (e.g., fuses and circuit breakers) and indicator lamps have been omitted from the embodiment shown in FIG. 8 (and from embodiments that are to be described hereafter) to facilitate the description. Those skilled in the art will appreciate, however, that protective devices and possibly also indicator lamps would, in practice, normally be employed, as in the embodiment shown in FIG. 7.

Those skilled in the art will also appreciate that relays 352 and 354 could be replaced by a SPDT relay and that relays 356 and 358 could likewise be replaced by a SPDT relay. Or relays 352–358 could all be replaced by a DPDT relay.

Figure 9:
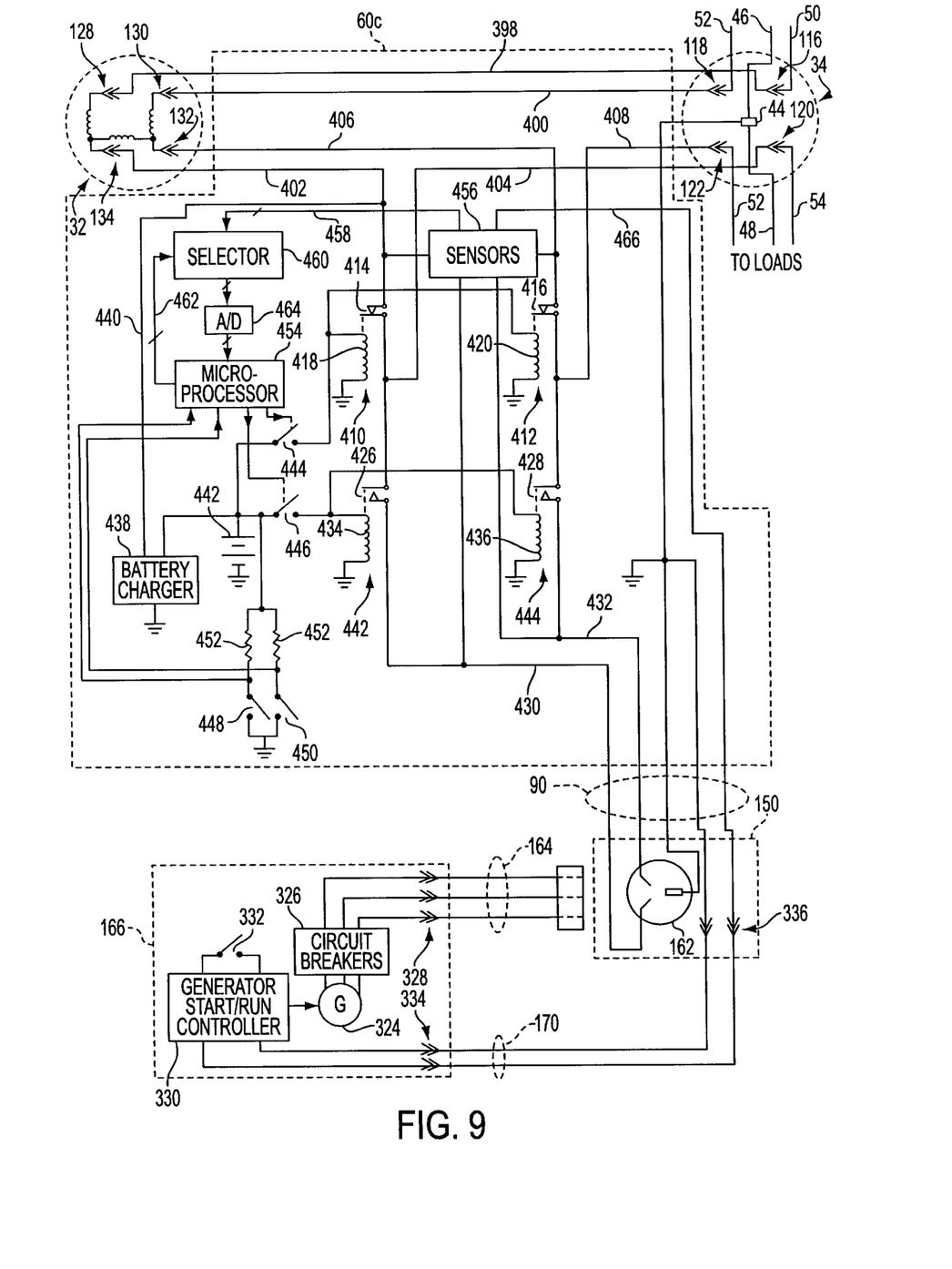
FIG. 9 is a schematic diagram illustrating a third embodiment of an interface circuit.

FIG. 9 illustrates another embodiment of a protective circuit, designated by reference number 60c. It includes a leg-1 conductor 398 linking the connectors 116 and 128, a leg-2 conductor 400 linking the connectors 118 and 130, a leg-1 conductor 402 that is connected to the connector 134, a leg-1 conductor 404 that is connected to the connector 120, a leg-2 conductor 406 that is connected to the connector 132, and a leg-2 conductor 406 that is connected to the connector 122.

Relays 410 and 412 include normally closed switches 414 and 416, respectively. The fixed contact of switch 414 is connected to leg-1 conductor 402 and the fixed contact of switch 416 is connected to leg-2 conductor 406. Relay 410 also includes a solenoid 418, one end of which is grounded, and relay 412 includes a solenoid 420, which likewise has an end that is grounded. Relays 422 and 424 have normally open switches 326 and 328 whose fixed contacts are connected respectively to conductors 430 and 432. Relays 422 and 424 also include solenoids 434 and 436, respectively. One end of each of these solenoids is grounded. The movable contact of switch 414 and the movable contact of switch 426 are connected to the leg-1 conductor 404, and likewise the movable conductor of switch 416 and the movable conductor of switch 428 are connected to leg-2 conductor 408.

A battery charger 438 has a first power input terminal that is connected by a conductor 440 to the leg-1 conductor 402 and a second power input terminal that is grounded. The charger 438 charges a battery 442, whose negative terminal is grounded and whose positive terminal is connected to electrically controlled switches 444 and 446. The ungrounded terminals of solenoids 418 and 420 are connected to switch 444 and the ungrounded terminals of solenoids 434 and 436 are connected to switch 446. When switch 444 is closed, current from battery 442 flows through solenoids 418 and 420 and consequently switches 414 and 416 are opened thereby disconnecting leg-1 conductors 402 and 404 and also disconnecting leg-2 conductors 406 and 408. On the other hand, when switch 446 is closed, current flows through solenoids 434 and 436, so that switches 426 and 428 are closed and leg-1 and leg-2 conductors 430 and 432 are connected respectively to leg-1 and leg-2 conductors 404 and 408.

The interface circuit 60c also includes manually operable switches 448 and 450, which are connected between ground and pull-up resistors 452 that in turn are connected to the positive terminal of battery 442. The switch 448 is accessible to the owner of on-site power source 166, but switch 450 is not accessible to the owner. The owner closes switch 448 if he or she wants the utility company's power lines to be automatically disconnected when the on-site power source 166 is running. Switch 450 is placed in a closed position by an agent of the utility company if the utility company will permit its power lines to be connected in parallel to the on-site power 116. If switch 450 is open, of course, the position of switch 448 makes no difference since switches 414 and 416 will be opened automatically (as will be explained below) when the on-site power 166 begins running, regardless of the setting of switch 448. Switches 448 and 450 provide input signals to a microprocessor 454.

The interface circuit 60c includes a sensor group 456 that receives signals from leg-1 and leg-2 conductors 402 and 406 and from leg-1 and leg-2 conductors 430 and 432. Signals from the sensors are supplied over a multi-conductor analog bus 458 to a selector 460, which receives selection signals from the microprocessor 454 over a digital bus 462. The selected sensor signals pass through the selector 460 and are converted to digital by an A/D converter 464 to provide input signals to the microprocessor 454. The sensor group 456 preferably includes voltage sensors, current sensors, and a phase-locked loop. The PLL in sensor 456 provides a signal that is conveyed via a conductor 466 and the connectors 336 to the generator start/run controller 330. The controller 330 uses the signal to adjust the speed of the engine driving generator 324 so that its output matches the utility company's power in frequency and phase. In the case of an on-site power supply of the type that includes batteries or some other DC source and an inverter, the signal from the PLL would be used to control the inverter so that its output would match the utility company's power in frequency and phase.

The operation of interface circuit 60c will now be described. Microprocessor 454 normally emits digitally low signals to switches 444 and 446. This keeps the switches open and isolates the solenoids of all four relays from the battery 442. In this state, the switches 426 and 428 are open, and switches 414 and 416 are closed to connect the leg-1 conductors 402 and 404 and the leg-2 conductors 406 and 408. The microprocessor 454 also repeatedly controls the selector 460 to pass sensor signals which indicate the voltage across leg-1 and leg-2 conductors 430 and 432. If the sensed voltage across conductors 430 and 432 rises past a predetermined level, the microprocessor checks the state of switches 448 and 450. If switch 448 is closed, indicating that the owner of on-site power source 166 wants to use the source 166 only and to disconnect the utility, the microprocessor waits until the voltage and frequency on leg-1 and leg-2 conductors 430 and 432 are within a first acceptable (the frequency can be determined by microprocessor 454 by repeatedly sampling the voltage over a time interval corresponding to a few cycles of the commercial power). If the sensed voltage and frequency are within the first acceptable range, the microprocessor 454 emits a digitally high signal to switch 444, thus actuating relays 410 and 412 to disconnect the leg-1 and leg-2 conductors 402 and 406, and then emits a digitally high signal to switch 446, thus actuating relays 422 and 424. This connects the leg-1 and leg-2 conductors 430 and 432 to the leg-1 and leg-2 conductors 404 and 408 via the switches 426 and 428.

What has been described as the "first acceptable range" is provided for the protection of the owner of the on-site power source 166. The first acceptable range can be rather loose, excluding only voltages and/or frequencies that would probably be unacceptable to the owner of the on-site source 166 and possibly damage his loads. That is, the first acceptable range is a complimentary protective feature that is designed to keep the owner's on-site power source from damaging the owner's own loads.

A second acceptable range is employed by the microprocessor 454 if the switch 448 is opened (indicating that the owner of the on-site power source would like to operate it in parallel with the utility) and if the switch 454 is closed (indicating that the utility company is willing to permit such parallel operation). If parallel operation is desired by the owner and permitted by the utility company, as indicated by switches 448 and 450, after microprocessor 454 detects that the voltage across leg-1 and leg-2 conductors 430 and 432 has risen past the predetermined level it also detects whether the voltage, frequency, and phase on the conductors 430 and 432 closely match the voltage, frequency, and phase on conductors 402 and 406. If so, the microprocessor 454 closes switch 446 while keeping switch 444 open, thus closing switches 426 and 428 so as to connect on-site power source 166 in parallel with the service lines 50 and 52.

It is possible that the on-site power source 166 may malfunction in some way after parallel operation has been initiated. However, the on-site power source 166 would normally have a power capability that is substantially smaller than that of the utility company, and it is believed that a malfunction which develops after the initiation of parallel operation would not seriously perturb the utility company's distribution network or harm other customers. Nevertheless, after the microprocessor 454 initiates parallel operation it continues to monitor the current through leg-1 and leg-2 conductors 402 and 406, and deactuates relays 410 and 412 to open switches 414 and 416 if the current becomes excessive.

Once interface circuit 60c has initiated parallel operation, it maintains parallel operation until the on-site power source 116 is turned off unless, as was mentioned above, the current carried by conductors 402 and 406 becomes excessive. The microprocessor 454 decides that the power source 166 has been turned off if the current through leg-1 and leg-2 conductors 430 and 432 falls below a predetermined level. The microprocessor thereupon emits a digitally low signal to the switch 446, thereby deactuating the relays 422 and 424 and opening switches 426 and 428. This returns the interface circuit 60c to the original state before the parallel operation began.

Those skilled in the art will appreciate that relays 410 and 412 can be replaced by a DPST relay, and so can relays 422 and 424. interface circuits 60a and 60b that were described previously with reference to FIGS. 7 and 8 automatically disconnect the utility company's power lines when on-site power is used. This protects the utility company's power distribution network and other customers from damage that might be caused by an out-of-specification or out-of-phase on-site power source. It also protects technicians who may be working on a segment of the power lines that they have disconnected from the utility company's substation 20 (see FIG. 1). A portion of the utility company's distribution network that has been disconnected from a substation is sometimes called an "island" and for safety purposes it is desirable to ensure that such an island is not electrified by distributed on-site power sources (unless the line technicians have been trained to isolate the segment of the power lines they are working on not only from the substation, but also from customers). It would therefore be desirable to provide an interface circuit with an anti-islanding feature.

One way to provide such an anti-islanding feature would be for the utility company to superimpose what will be called an "anti-islanding tone" on its power lines. The frequency of the anti-islanding tone should be selected to be higher than the power distribution frequency (e.g., 60 Hz) but not a harmonic of the distribution frequency. The frequency selected for the anti-islanding tone should be low enough that the impedance of the distribution network at the selected frequency does not become excessive. If such an anti-islanding tone is superimposed on the power lines, the sensor group 456 of the interface circuit 60*c* that is shown in FIG. 9 may include sensors to detect its presence. Absence of the tone means that there is a break in the power lines or a purposeful disconnection between the anti-islanding tone source and the interface circuit 60*c*—meaning that the circuit 60*c* is connected to an isolated island of the utility's power distribution network—so the microprocessor 454 should not permit parallel operation if the anti-islanding tone disappears unless the utility company's line technicians have been suitably trained.

Figure 10:
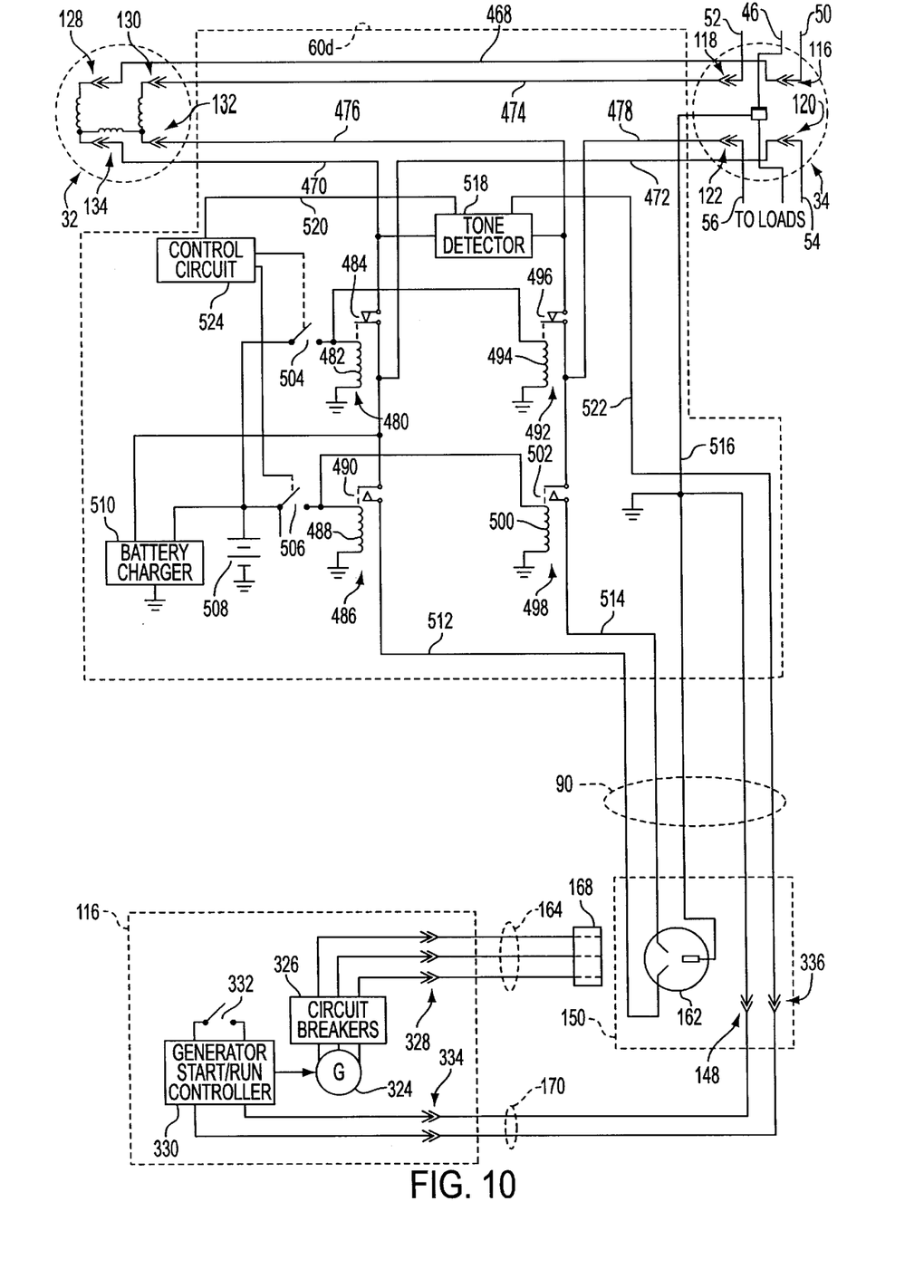
FIG. 10 is a schematic diagram illustrating a fourth embodiment of an interface circuit.

FIG. 10 illustrates an interface circuit 60*d* having a tone detectors 18 for detecting whether a tone is present. The interface circuit 60*d* includes a leg-1 conductor 468 which links connectors 116 and 128, a leg-1 conductor 470 which is connected to connector 134, and a leg-1 conductor 472 which is connected to connector 122. A leg-2 conductor 474 links connectors 118 and 130. A leg-2 conductor 476 is connected to connector 132 and another leg-2 conductor, 478, is connected to connector 122.

The interface circuit 60*d* also includes a relay 480 having a solenoid 482 and a normally closed switch 484; a relay 486 having a solenoid 488 and a normally open switch 490; a relay 492 having a solenoid 494 and a normally closed switch 496; and relay 498 having a solenoid 500 and a normally open switch 502. One end of each solenoid is grounded. The other ends of solenoids 482 and 494 are connected to an electrically controlled switch 504. The other ends of solenoids 488 and 500 are connected to an electrically controlled switch 506. The switches 504 and 506 are also connected to the positive terminal of a rechargeable battery 508, whose negative terminal is grounded. A battery charger 510 supplies a charging current to the battery 508.

One contact of receptacle 162 is connected to the fixed contact of switch 490 by a leg-1 conductor 512, and another contact of the receptacle 162 is connected to the fixed contact of switch 502 by a leg-2 conductor 514. The neutral contact of receptacle 162 is connected to neutral contact 44 by a conductor 516, which is grounded. The movable contact is switch 490 is connected to the movable contact of switch 484, and both are connected to the leg-1 conductor 472. Similarly, the movable contact of switch 502 is connected to the movable contact of switch 496, and both are connected to leg-2 conductor 478.

The interface circuit 60*d* also includes the tone detector 518, which has input terminals that are connected to the leg-1 and leg-2 conductors 470 and 476. The tone detector 518 emits output signals on conductors 520 and 522. The signal on conductor 520 is conveyed to a control circuit 524 and the signal on conductor 522 is ultimately conveyed to the controller 330.

The interface circuit 60*d* cooperates with a tone generator, not illustrated, that is coupled to the utility company's power lines. For example, a tone generator which provides a 275 Hz sinusoidal output that is capacitively coupled to the leg-1 and leg-2 ends of the secondary winding of transformer 22 in FIG. 1 could be employed. The tone detector 518 would also be tuned to 275 Hz. The presence of the 275 Hz tone at detector 518 means that both the leg-1 power line 26 and the leg-2 power line 28 are operative at least as far as the location of the tone generator. Consequently, when the tone can be detected, detector 518 emits an output signal on conductor 520 and, in response, the control circuit 524 keeps switches 504 and 506 open. As a result, normally closed switch 484 connects a leg-1 conductor 472 to the leg-1 conductor 470 and the normally open switch 490 keeps the leg-1 line 512 disconnected. Similarly, the normally closed switch 496 keeps the leg-2 conductor 478 connected to leg-2 conductor 476 while the normally open switch 502 keeps leg-2 conductor 514 disconnected. Should the 275 Hz signal disappear, however, detector 518 emits a signal on conductor 522 which causes controller 330 to start the generator 324. It also emits a signal via conductor 520 to control circuit 524, which then closes switch 504 to actuate relays 480 and 492 and cause switches 484 and 496 to open. Moments later the control circuit 524 also emits a signal to close switch 506, which actuates relays 486 and 498 so as to close switches 490 and 502. When the 275 Hz tone is thereafter detected again by detector 518, meaning that the power lines have been restored, relays 486 and 498 are deactuated to disconnect the on-site power source 166 and then relays 480 and 492 are deactuated to reconnect the power lines to the customer's distribution system. A signal emitted on conductor 522 causes the controller 330 to shut down the engine which drives generator 324.

It will be understood that the above description of the present invention is susceptible to various modifications, changes, and adaptations, and the same are intended to be comprehended within the meaning and range of equivalents of the appended claims. Several such modifications, changes, or adaptations will be specifically mentioned below.

Although the embodiments of an interface circuit that are illustrated in FIGS. 7–10 all employ electromechanical relays, solid state relays or other switching arrangements could be employed instead. Similarly, in lieu of the electrically controllable latching switch assembly 212 that is shown in FIG. 7, a solid state arrangement could be used. Such a solid state arrangement might include, for example, a pair of solid state relays.

The embodiments of an interface circuit shown in FIGS. 7, 9, and 10 may be located completely within the meter collar, with the possibility of also locating one or more components of the interface circuit in the box 142 shown in FIG. 3 (in the embodiment shown in FIG. 8, however, it is desirable for the switches 376 and 378 to be mounted in the connector assembly 150). In particular, the switchover relay 224 and input circuit 254 shown in FIG. 7 may be located in box 142, with the remaining components being located in the meter collar. However, it is also possible to mount the switchover relay 224 and the input circuit 254 in the meter collar along with the remaining components of the interface circuit, in which case the box 124 can be omitted. The cable 90 would then lead directly to the connector assembly 150.

The receptacle 162 can be mounted directly on the meter collar, without a separate connector assembly 150 that is attached to the wall 114, but using the connector 150 reduces the mechanical stress that would otherwise be placed on the meter collar when the on-site power source is connected or disconnected.

Using a meter collar in conjunction with a interface circuit provides a convenient and economical way for a customer with a conventional meter and meter socket box to connect an on-site power source. That is, the customer's existing installation can be retrofit by way of the meter collar so as to accommodate an on-site power source. However it is anticipated that, in the future, the private distribution systems of residential customers or small business customers may be designed of ab initio to accommodate an on-site power source. In such a case, the interface circuit could be used without the meter collar by placing the interface circuit in the customer's meter socket box or circuit breaker box, for example.

The meter itself has been described as an electromechanical meter, but an ordinarily skilled person would appreciate that an all-electrical meter could be employed instead.

What I claim is:

1. An interface circuit for connecting either a first power source or a second power source to a load, comprising:
    a first switching unit having an open state and a closed state, the first switching unit connecting the load to the first power source when it is in its closed state and isolating the load from the first power source when it is in its open state, the first switching unit being responsive to a first control signal;
    a second switching unit having an open state and a closed state, the second switching unit connecting the load to the second power source when it is in its closed state and isolating the load from the second power source when it is in its open state, the second switching unit being responsive to a second control signal; and
    circuitry interconnecting the first and second switching units to keep them both from being in their closed states simultaneously, even if one of the switching units malfunctions and remains in its closed state without being responsive to its control signal.

2. The interface circuit of claim 1, wherein the circuitry interconnecting the first and second switching units comprises a third switching unit that is connected to the first and second switching units.

3. The interface circuit of claim 2, wherein the circuitry interconnecting the first and second switching units further comprises a fourth switching that is connected to the first, second, and third switching units.

4. The interface circuit of claim 3, wherein three of the switching units comprise relays and one of the switching units comprises an electrically controllable latching switch assembly, and wherein the first control signal is a currently flowing momentarily in a first direction to change the open state of the first switching unit to the closed state, and flowing momentarily in a second direction to change the closed state of the first switching unit to the open state.

5. The interface circuit of claim 1, wherein the first switching unit comprises an electrically controllable latching switch assembly, and wherein the first control signal is a currently flowing momentarily in a first direction to change the open state of the first switching unit to the closed state, and flowing momentarily in a second direction to change the closed state of the first switching unit to the open state.

6. The interface circuit of claim 5, wherein the second switching unit comprises a relay, and wherein the second control signal is a current that flows when the second switching unit is in one of its states but does not flow when the second control signal is in the other of its states.

7. The interface circuit of claim 1, wherein the first and second power sources are AC power sources, the first switching unit comprises an electromechanical switch, and the second switching unit comprises an electromechanical switch.

8. The interface circuit of claim 7, wherein the means interconnecting the first and second switching units comprises detecting means for detecting whether the second power source is supplying power and for detecting whether the first power source is supplying power in the event that the second power source is not supplying power, the detecting means comprising at least one further electromechanical switch having switchable contacts that selectively convey the first control signal to the first switching unit.

9. An interface circuit for connecting either a first power source or a second power source to a load, comprising:
    an electrically controlled latching switch assembly having an open state and a closed state, the latching switch assembly connecting the load to the first power source when it is in its closed state and isolating the load from the first power source when it is in its open state, the latching switch assembly being responsive to a first control signal that comprises a current flowing momentarily in a first direction to change the open state of the latching switch assembly to the closed state, and flowing momentarily in a second direction to change the closed state of the latching switch assembly to the open state; and
    a relay having an open state and a closed state, the relay connecting the load to the second power source when the relay it is in its closed state and isolating the load from the second power source when the relay is in its open state, the relay being responsive to a second control signal that comprises a current which flows when the relay is in one of its states but does not flow when the relay is in the other of its states,
        wherein the first and second control signals are timed such that the latching switch assembly and the relay are not in their closed states simultaneously.

10. The interface circuit of claim 9, wherein the first and second control signals are generated by switching units that interconnect the latching switch assembly and the relay.

11. The interface circuit of claim 9, wherein the first power source is a public utility that distributes AC power to loads over a large area, and the second power source is an on-site power source that distributes AC power locally.

* * * * *